(12) United States Patent
Fukano

(10) Patent No.: US 12,449,474 B2
(45) Date of Patent: Oct. 21, 2025

(54) DRIVE CONTROL DEVICE, DRIVE CONTROL METHOD, PROGRAM AND PROBER

(71) Applicant: Tokyo Seimitsu Co., Ltd., Hachioji (JP)

(72) Inventor: Eiji Fukano, Hachioji (JP)

(73) Assignee: Tokyo Seimitsu Co., Ltd., Hachioji (JP)

( * ) Notice: Subject to any disclaimer, the term of this patent is extended or adjusted under 35 U.S.C. 154(b) by 149 days.

(21) Appl. No.: 18/583,858

(22) Filed: Feb. 22, 2024

(65) Prior Publication Data

US 2024/0319263 A1    Sep. 26, 2024

(30) Foreign Application Priority Data

Mar. 22, 2023 (JP) .................................. 2023-045535

(51) Int. Cl.
  *G01R 31/28* (2006.01)
  *H01L 21/66* (2006.01)

(52) U.S. Cl.
  CPC ..... *G01R 31/2887* (2013.01); *G01R 31/2853* (2013.01); *H01L 22/14* (2013.01); *H01L 22/20* (2013.01)

(58) Field of Classification Search
  CPC ............ G01R 31/2887; G01R 31/2853; G01R 31/2891; G01R 1/06711; G01R 31/2863; G01R 31/2879; H01L 22/14; H01L 22/20
  USPC ....................... 324/750.22, 750.16, 537, 500
  See application file for complete search history.

(56) References Cited

U.S. PATENT DOCUMENTS

| 11,119,148 B2* | 9/2021 | Nieves | G01R 31/2891 |
| 11,486,899 B2* | 11/2022 | Tsai | G01R 31/2863 |
| 2023/0194569 A1* | 6/2023 | Meier | G01R 31/2889 |
| | | | 324/754.04 |

FOREIGN PATENT DOCUMENTS

JP      2022-173284 A      11/2022

* cited by examiner

*Primary Examiner* — Giovanni Astacio-Oquendo
(74) *Attorney, Agent, or Firm* — Yokoi & Co., U.S.A.; Toshiyuki Yokoi

(57) ABSTRACT

A drive control device including an operation instruction transmission unit configured to transmit an operation instruction to a motor driving device for operating a movement mechanism of a wafer chuck; an information acquisition unit (62) configured to acquire a position deviation information including a position deviation at an actual position of the wafer chuck with respect to a position of the wafer chuck in the operation instruction; an analysis unit (64) configured to analyze the position deviation information; and a determination unit configured to determine an existence or absence of an occurrence of an abnormal operation of the movement mechanism based on an analysis result of the position deviation information can suppress a breakage of the wafer or the like in a state that the wafer and a probe are in contact with each other.

11 Claims, 9 Drawing Sheets

DRIVE CONTROL DEVICE, DRIVE CONTROL METHOD, PROGRAM AND PROBER

CROSS-REFERENCE TO RELATED APPLICATIONS

This patent specification is based on Japanese patent application, No. 2023-045535 filed on Mar. 22, 2023 in the Japan Patent Office, the entire contents of which are incorporated by reference herein.

PRIOR ART

[Patent Document 1] Japanese Unexamined Patent Application Publication No. 2022-173284

BACKGROUND OF THE INVENTION

The present disclosure relates to a drive control device, a drive control method, a program and a prober applied to an inspection of electric characteristics of semiconductor chips formed on a wafer.

In the prober, proves are connected to each of electrode pads provided on a plurality of semiconductor chips formed on the wafer, test signals are supplied from the probes to the electrode pads and signals outputted from the electrode pads are measured by using a test head.

Patent Document 1 discloses a prover for measuring electric characteristics of semiconductor chips formed on a wafer. The prober disclosed in Patent Document 1 includes an alignment device for movably supporting a wafer chuck on which the wafer is held in an X direction, a Y direction, a Z direction and a θ direction freely. The alignment device moves the wafer chuck in the X direction, the Y direction, the Z direction and the θ direction appropriately to align the wafer and the probe relatively.

SUMMARY OF THE INVENTION

The wafer and the probe are aligned with each other and then contacted with each other to stop them. In this state, the prober performs various measurements. At this time, there is a risk that the wafer and/or the probe are unintentionally broken.

Conventionally, when the breakage of the probe (probe card) or the wafer is found, the cause is investigated and countermeasures are carried out if the cause is due to an abnormal operation of a movement mechanism which moves the wafer and the probe relatively.

Namely, the possibility of the occurrence of the abnormality of the movement mechanism is recognized for the first time when the breakage of the probe (probe card) or the wafer occurs and the countermeasures such as a repair are carried out after that.

In this case, as a matter of course, the expensive probe card and/or the wafer have already broken when the abnormality of the movement mechanism is found. This is a problem.

The above described problem occurs because it is not sufficiently recognized that the abnormal operation of the movement mechanism is one of the reason of causing the breakage of the wafer and/or the probe card. Actually, there is no description in Patent Document 1 about the breakage of the wafer or the like due to the abnormal operation of the movement mechanism for relatively moving the wafer (wafer chuck) and the probe. Accordingly, there is no disclosure about the method of preventing the breakage of the wafer or the like and the method of recognizing the abnormal operation of the movement mechanism.

The present disclosure provides a drive control device, a drive control method, a program and a prober capable of preventing the breakage of the wafer or the like in a state that the wafer and the probe are contacted with each other.

One aspect of the drive control device of the present disclosure is a drive control device including: an operation instruction transmission unit configured to transmit an operation instruction to a motor driving device for operating a movement mechanism of a wafer chuck which holds a wafer on which a plurality of semiconductor chips is formed; an information acquisition unit configured to acquire a position deviation information including at least one position deviation at an actual position of the wafer chuck with respect to a position of the wafer chuck in the operation instruction; an analysis unit configured to analyze the position deviation information; and a determination unit configured to determine an existence or absence of an occurrence of an abnormal operation of the movement mechanism based on an analysis result of the position deviation information.

One aspect of the drive control method of the present disclosure is a drive control method including steps performed by a computer of: an operation instruction transmission step of transmitting an operation instruction to a motor driving device for operating a movement mechanism of a wafer chuck which holds a wafer on which a plurality of semiconductor chips is formed; an information acquisition step of acquiring a position deviation information including at least one position deviation at an actual position of the wafer chuck with respect to a position of the wafer chuck in the operation instruction; an analysis step of analyzing the position deviation information; and a determination step of determining an existence or absence of an occurrence of an abnormal operation of the movement mechanism based on an analysis result of the position deviation information.

One aspect of the program of the present disclosure is a program performed by a computer, the program including: an operation instruction transmission function of transmitting an operation instruction to a motor driving device for operating a movement mechanism of a wafer chuck which holds a wafer on which a plurality of semiconductor chips is formed; an information acquisition function of acquiring a position deviation information including at least one position deviation at an actual position of the wafer chuck with respect to a position of the wafer chuck in the operation instruction; an analysis function of analyzing the position deviation information; and a determination function of determining an existence or absence of an occurrence of an abnormal operation of the movement mechanism based on an analysis result of the position deviation information.

One aspect of the prober of the present disclosure is a prober including: a wafer chuck configured to hold a wafer on which a plurality of semiconductor chips is formed; a test head having a probe which supplies a test signal to the plurality of semiconductor chips; a movement mechanism configured to move the wafer chuck relatively to the probe; a motor configured to operate the movement mechanism; a motor driving device configured to supply a drive current to the motor; and a drive control device configured to transmit an operation instruction to the motor driving device, wherein the drive control device includes: an operation instruction transmission unit configured to transmit an operation instruction to the motor driving device for operating the movement mechanism of the wafer chuck which holds the wafer on which a plurality of semiconductor chips is formed; an information acquisition unit configured to acquire a position deviation information including at least one position deviation at an actual position of the wafer chuck with respect to a position of the wafer chuck in the operation instruction; an analysis unit configured to analyze the position deviation information; and a determination unit configured to determine an existence or absence of an occurrence of an abnormal operation of the movement mechanism based on an analysis result of the position deviation information.

When the drive control device of the present disclosure is used, the existence or absence of the abnormal operation of the movement mechanism of the wafer chuck is determined based on the analysis result of the position deviation information including the position deviation of the wafer chuck. Consequently, the countermeasures can be carried out by retreating the wafer from the test head, for example.

DETAILED DESCRIPTION OF THE INVENTION

Figure 1:
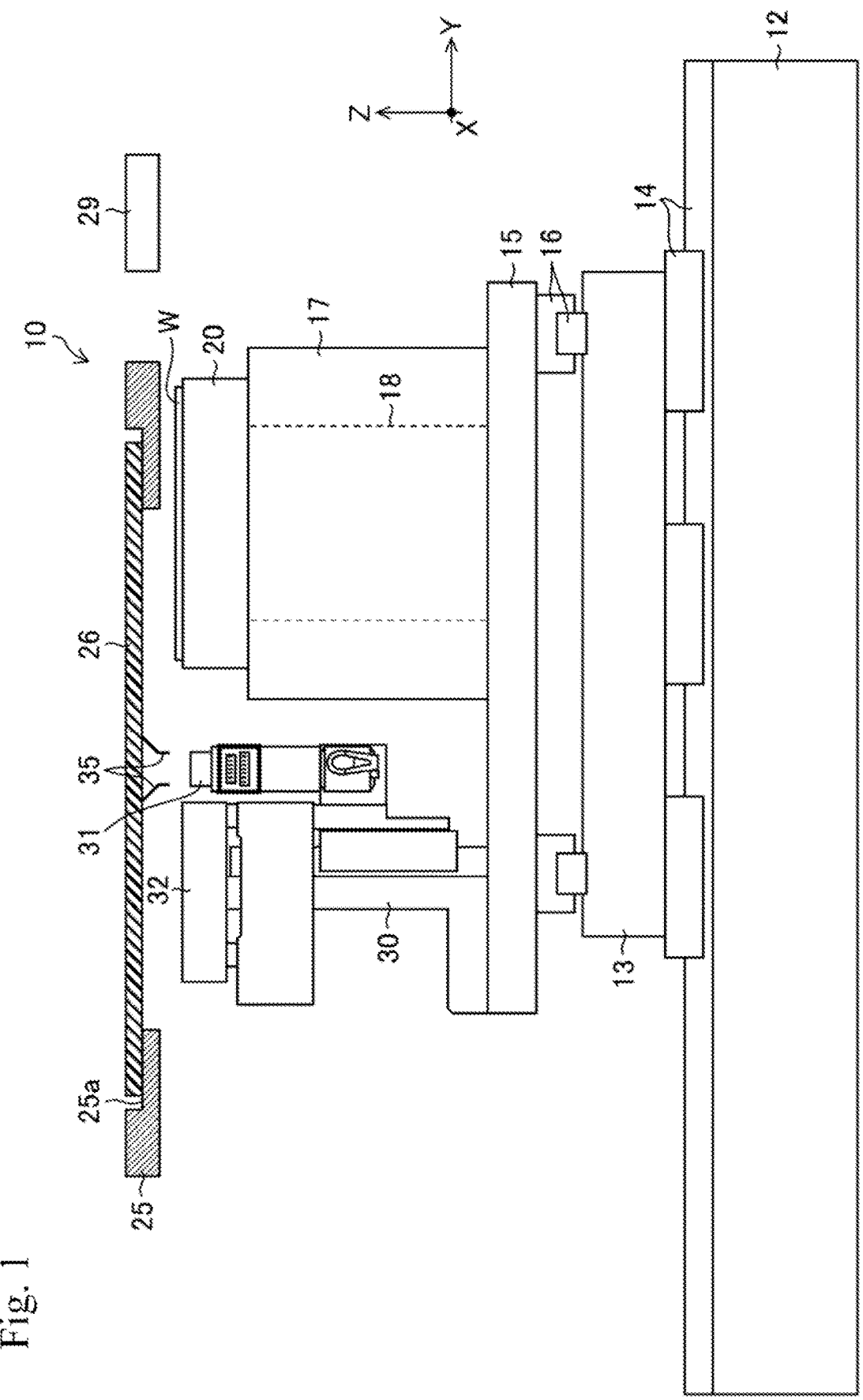
FIG. 1 is a schematic configuration diagram of the first embodiment of a prober.

The first aspect of the drive control device of the present disclosure is a drive control device including: an operation instruction transmission unit configured to transmit an operation instruction to a motor driving device for operating a movement mechanism of a wafer chuck which holds a wafer on which a plurality of semiconductor chips is formed; an information acquisition unit configured to acquire a position deviation information including at least one position deviation at an actual position (location) of the wafer chuck with respect to a position (location) of the wafer chuck in the operation instruction; an analysis unit configured to analyze the position deviation information; and a determination unit configured to determine an existence or absence of an occurrence of an abnormal operation of the movement mechanism based on an analysis result of the position deviation information.

When the above described drive control device is used, the existence or absence of the abnormal operation of the movement mechanism of the wafer chuck is determined based on the analysis result of the position deviation information including the position deviation of the wafer chuck. Consequently, the countermeasures can be carried out by retreating the wafer from the test head, for example.

The position deviation of the wafer chuck can be calculated based on an output signal of an encoder mounted on a rotation axis of the motor and a position information calculated from an output signal of an encoder provided on a driving mechanism of the wafer chuck. The position information includes an actual position of the wafer chuck. It is also possible to measure the actual position of the wafer chuck by using a position detector such as a linear scale.

It is possible for the movement mechanism of the wafer chuck to relatively move the wafer and the probe in a plurality of directions different from each other. The first direction and the second direction located in the orthogonal coordinate system of the surface on which the wafer is held, the third direction orthogonal to the surface on which the wafer is held and the fourth direction which is a rotation direction around a rotation axis where the fourth direction is in parallel with the third direction can be examples of the plurality of directions different from each other.

It is possible for the determination unit to determine (judge) the existence or absence of the abnormal operation of the movement mechanism based on the analysis result of the position deviation information for each of the plurality of directions different from each other. It is possible for the determination unit to determine that the abnormal operation of the movement mechanism occurs when the abnormal operation of the movement mechanism occurs in at least one of the plurality of directions which are different from each other.

In the second aspect of the drive control device of the present disclosure, the determination unit is configured to determine that the abnormal operation of the movement mechanism occurs when the at least one position deviation exceeds a predetermined first threshold value in a state that the movement mechanism is stopped and the wafer is in contact with a probe which supplies a test signal to the plurality of semiconductor chips in the drive control device with the first aspect.

When the above described drive control device is used, the existence or absence of the occurrence of the abnormal operation of the movement mechanism of the wafer chuck can be determined based on the result of the determination of the threshold value with respect to the analysis result of the position deviation of the wafer chuck.

In the third aspect of the drive control device of the present disclosure, the at least one position deviation includes a plurality of position deviations. Namely, the information acquisition unit is configured to acquire the plurality of position deviations in time series in a state that the movement mechanism is stopped and the wafer is in contact with a probe which supplies a test signal to the plurality of semiconductor chips, the analysis unit is configured to perform a frequency analysis of the plurality of position deviations in time series, and the determination unit is configured to determine that the abnormal operation of the movement mechanism occurs when frequencies of the plurality of position deviations vary from each other in the drive control device with the first aspect.

When the above described drive control device is used, the existence or absence of the mechanical damage of the wafer chuck or the like can be determined based on the variation of the frequency about a plurality of position deviations of the wafer chuck in order of time series.

In the fourth aspect of the drive control device of the present disclosure, the information acquisition unit acquires torque information including a magnitude of a generation torque of the motor when the movement mechanism is operated based on the operation instruction, the analysis unit is configured to analyze the torque information, and the determination unit is configured to determine the existence or absence of the occurrence of the abnormal operation of the movement mechanism based on the analysis result of the torque information in the drive control device with any one of the first to third aspects.

When the above described drive control device is used, the existence or absence of the occurrence of the abnormal operation of the drive mechanism can be determined based on the analysis result of the torque information when the movement mechanism is operated based on the operation instruction.

In the fifth aspect of the drive control device of the present disclosure, the determination unit is configured to determine that the abnormal operation of the movement mechanism occurs when the generation torque of the motor exceeds a predetermined second threshold value in the drive control device with the fourth aspect.

When the above described drive control device is used, the existence or absence of the occurrence of the abnormal operation of the movement mechanism of the wafer chuck can be determined based on the result of the determination of the threshold value with respect to the generation torque of the motor.

In the sixth aspect of the drive control device of the present disclosure, the information acquisition unit is configured to acquire a drive current information including a magnitude of a drive current supplied to the motor when the movement mechanism is operated based on the operation instruction, the analysis unit is configured to analyze the drive current information, and the determination unit is configured to determine the existence or absence of the occurrence of the abnormal operation of the movement mechanism based on the analysis result of the drive current information in any one of the first to fourth aspects.

When the above described drive control device is used, the existence or absence of the occurrence of the abnormal operation of the movement mechanism can be determined based on the analysis result of the drive current information when the movement mechanism is operated based on the operation instruction.

In the seventh aspect of the drive control device of the present disclosure, the determination unit is configured to determine that the abnormal operation of the movement mechanism occurs when the magnitude of the drive current exceeds a third threshold value in the drive control device with the sixth aspect.

When the above described drive control device is used, the existence or absence of the occurrence of the abnormal operation of the movement mechanism of the wafer chuck can be determined based on the result of the determination of the threshold value with respect to the drive current.

In the eighth aspect of the drive control device of the present disclosure, the operation instruction transmission unit is configured to transmit the operation instruction to the motor driving device for separating a probe which supplies a test signal to the plurality of semiconductor chips and the wafer from each other when the abnormal operation of the movement mechanism occurs in the drive control device with any one of the first to seventh aspects.

When the above described drive control device is used, the wafer and the probe are separated from each other when the abnormal operation of the movement mechanism occurs. Consequently, the breakage of the wafer or the like can be prevented.

The ninth aspect of the drive control device of the present disclosure further includes a display controller configured to transmit a display signal indicating a determination result of the determination unit to a display in the drive control device with any one of the first to eighth aspects.

When the above described drive control device is used, the determination result is notified using the display. Consequently, the operator can recognize the determination result of the determination unit.

When it is determined that the abnormal operation of the movement mechanism occurs, the display controller can transmit the display signal indicating the occurrence of the abnormal operation to the display.

The first aspect of the drive control method of the present disclosure is a drive control method including steps performed by a computer of: an operation instruction transmission step of transmitting an operation instruction to a motor driving device for operating a movement mechanism of a wafer chuck which holds a wafer on which a plurality of semiconductor chips is formed; an information acquisition step of acquiring a position deviation information including at least one position deviation at an actual position of the wafer chuck with respect to a position of the wafer chuck in the operation instruction; an analysis step of analyzing the position deviation information; and a determination step of determining an existence or absence of an occurrence of an abnormal operation of the movement mechanism based on an analysis result of the position deviation information.

When the above described drive control method is used, the operation and the effect same as those of the first aspect of the drive control device can be obtained.

Note that the drive control method of the first aspect can be appropriately combined with the matter same as the matter identified in any one of the second to ninth aspects of the drive control device. In that case, the elements for performing the processes and the functions identified in the drive control device can be recognized as the elements of the drive control method for performing the corresponding processes and functions.

The first aspect of the program of the present disclosure is a program performed by a computer, the program including: an operation instruction transmission function of transmitting an operation instruction to a motor driving device for operating a movement mechanism of a wafer chuck which holds a wafer on which a plurality of semiconductor chips is formed; an information acquisition function of acquiring a position deviation information including at least one position deviation at an actual position of the wafer chuck with respect to a position of the wafer chuck in the operation instruction; an analysis function of analyzing the position deviation information; and a determination function of determining an existence or absence of an occurrence of an abnormal operation of the movement mechanism based on an analysis result of the position deviation information.

When the above described program is used, the operation and the effect same as those of the first aspect of the drive control device can be obtained.

Note that the program of the first aspect can be appropriately combined with the matter same as the matter identified in any one of the second to ninth aspects of the drive control device. In that case, the elements for performing the processes and the functions identified in the drive control device can be recognized as the elements of the program for performing the corresponding processes and functions.

The first aspect of the prober of the present disclosure is a prober including: a wafer chuck configured to hold a wafer on which a plurality of semiconductor chips is formed; a test head having a probe which supplies a test signal to the plurality of semiconductor chips; a movement mechanism configured to move the wafer chuck relatively to the probe;

a motor configured to operate the movement mechanism; a motor driving device configured to supply a drive current to the motor; and a drive control device configured to transmit an operation instruction to the motor driving device, wherein the drive control device includes: an operation instruction transmission unit configured to transmit an operation instruction to the motor driving device for operating the movement mechanism of the wafer chuck which holds the wafer on which a plurality of semiconductor chips is formed; an information acquisition unit configured to acquire a position deviation information including at least one position deviation at an actual position of the wafer chuck with respect to a position of the wafer chuck in the operation instruction; an analysis unit configured to analyze the position deviation information; and a determination unit configured to determine an existence or absence of an occurrence of an abnormal operation of the movement mechanism based on an analysis result of the position deviation information.

When the above described prober is used, the operation and the effect same as those of the first aspect of the drive control device can be obtained.

Note that the prober of the first aspect can be appropriately combined with the matter same as the matter identified in any one of the second to ninth aspects of the drive control device. In that case, the elements for performing the processes and the functions identified in the drive control device can be recognized as the elements of the prober for performing the corresponding processes and functions.

Hereafter, the embodiments will be explained in detail in accordance with the attached drawings. In the specification, the same reference numeral is assigned to the same elements and repeated explanation is omitted appropriately.

[Configuration Example of First Embodiment of Prober]

Figure 2:
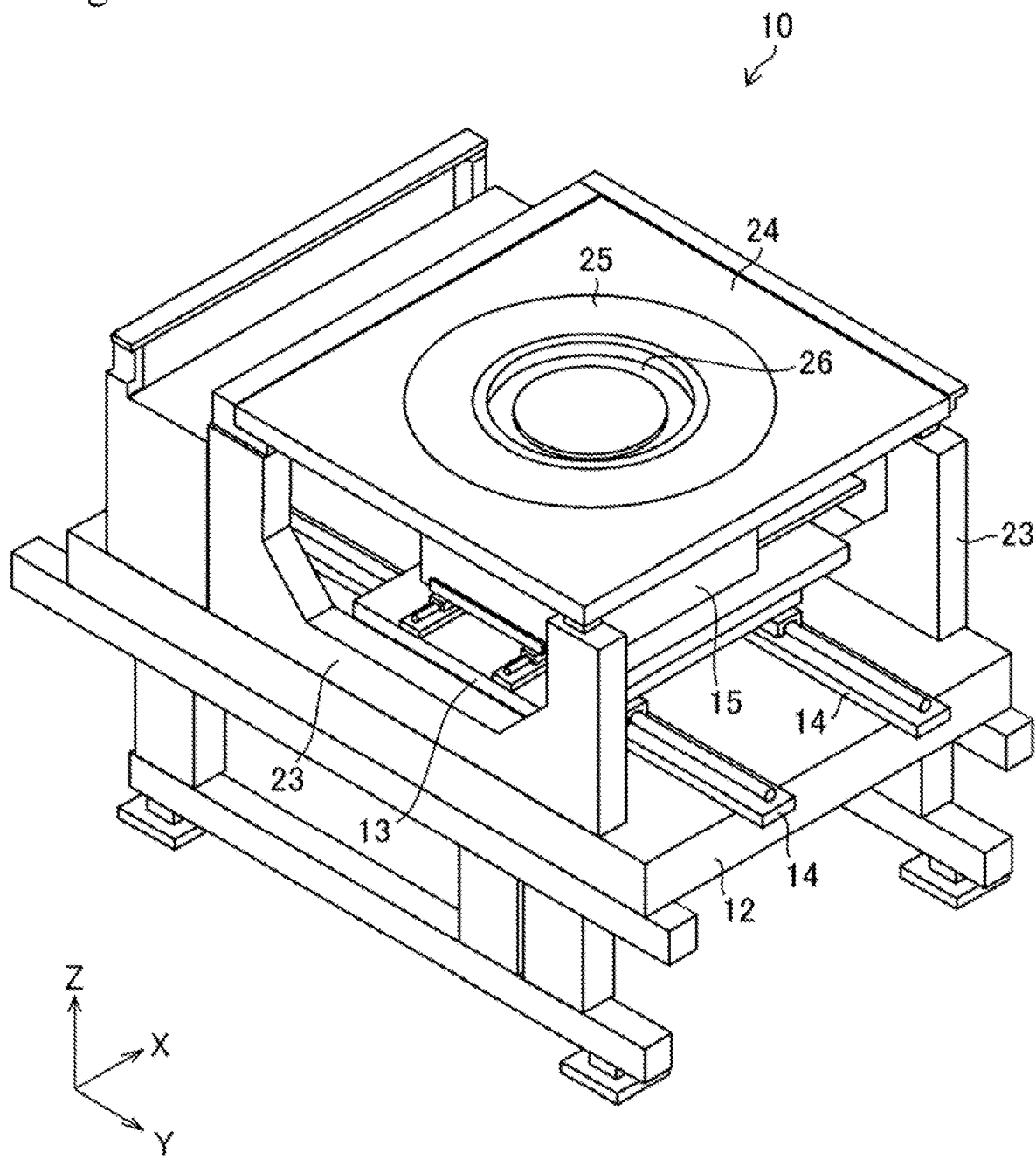
FIG. 2 is an external perspective view of the prober shown in FIG. 1.
Figure 3:
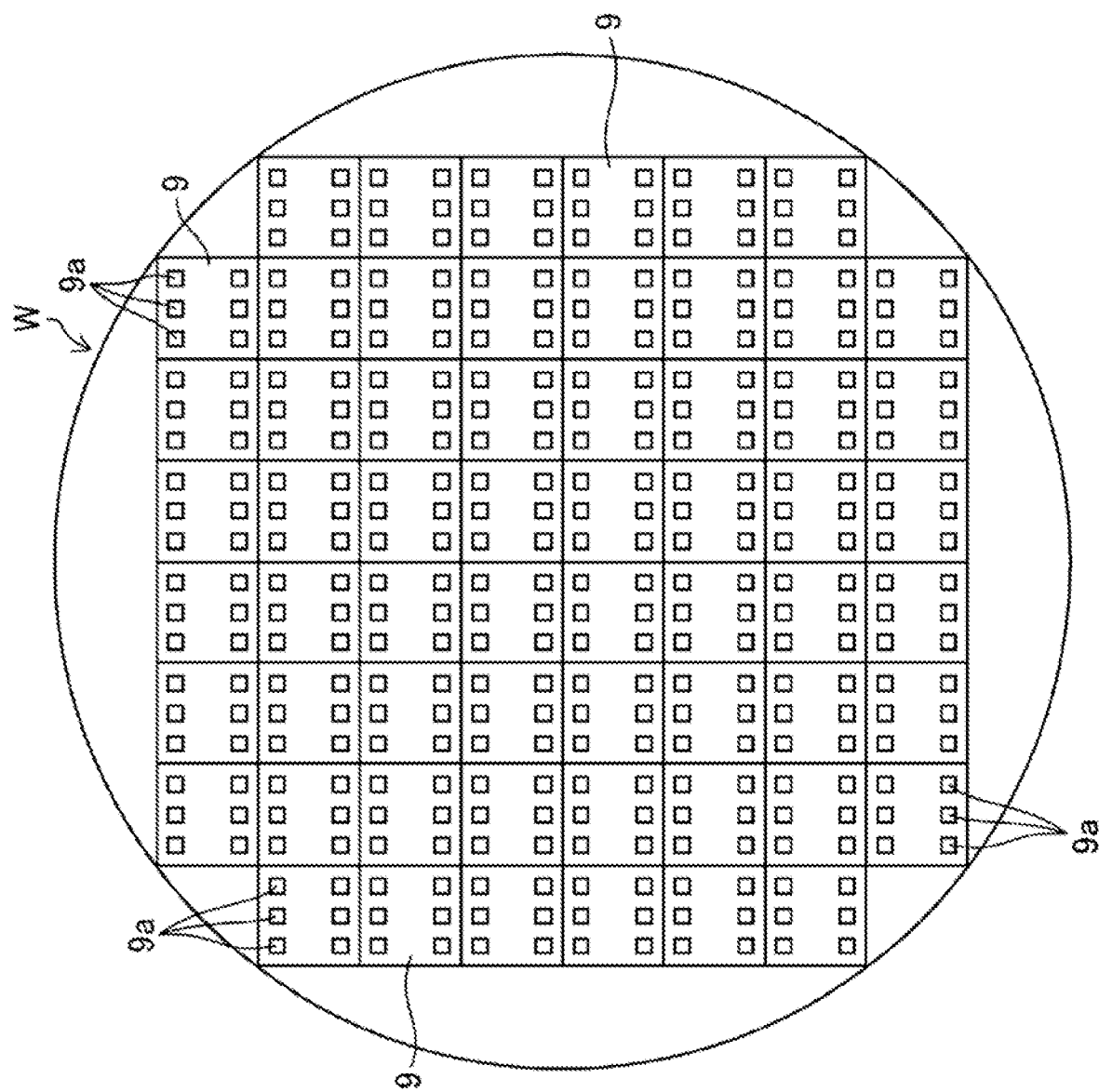
FIG. 3 is a top view of a wafer.

FIG. 1 is a schematic configuration diagram of the first embodiment of a prober. FIG. 2 is an external perspective view of the prober shown in FIG. 1. FIG. 3 is a top view of a wafer. A prober 10 shown in FIG. 1 and FIG. 2 is used for a wafer test system for testing electric characteristics of a plurality of semiconductor chips formed on the wafer. A wafer W tested by using the prober 10 is shown in FIG. 3.

In FIG. 3, an upper surface of the wafer W held on a wafer chuck 20 is illustrated. A plurality of semiconductor chips 9 is formed on the wafer W. A plurality of electrode pads 9a is formed on each of the semiconductor chips 9.

The prober 10 shown in FIG. 1 and FIG. 2 includes a base 12, a Y stage 13, a Y moving unit 14, an X stage 15, an X moving unit 16, a Zθ stage 17, a Zθ moving unit 18 and a wafer chuck 20 which are shown in FIG. 1. In addition, the prober 10 includes supports 23, a head stage 24, a card holder 25 and a probe card 26 which are shown in FIG. 2. Furthermore, the prober 10 includes a wafer alignment camera 29, an up-down stage 30, a needle alignment camera 31 and a cleaning plate 32 which are shown in FIG. 1. Note that the configuration of the prober 10 is not limited to the embodiment shown in FIG. 1 and FIG. 2. The configuration can be changed appropriately.

The Y stage 13 is supported on the upper surface of the base 12 via the Y moving unit 14 so that the Y stage 13 is freely movable in the Y-axis direction. The Y moving unit 14 moves the Y stage 13 in the Y-axis direction on the upper surface of the base 12.

The Y moving unit 14 can include a guide rail arranged on the upper surface of the base 12, for example. More specifically, the Y moving unit 14 can include a guide rail arranged in parallel with the Y-axis, a slider arranged on the lower surface of the Y stage 13 and a Y motor for driving the Y stage 13 in the Y-axis direction. Note that the slider is engaged with the guide rail.

The X stage 15 is supported on the upper surface of the Y stage 13 via the X moving unit 16 so that the X stage 15 is freely movable in the X-axis direction. The X moving unit 16 moves the X stage 15 in the X-axis direction on the upper surface of the Y stage 13.

The X moving unit 16 can include a guide rail arranged on the upper surface of the Y stage 13, for example. More specifically, the X moving unit 16 can include a guide rail arranged in parallel with the X-axis, a slider arranged on the lower surface of the X stage 15 and an X motor for driving the X stage 15 in the X-axis direction. Note that the slider is engaged with the guide rail.

The Zθ stage 17 and the up-down stage 30 are arranged on the upper surface of the X stage 15. The Zθ stage 17 includes the Zθ moving unit 18. The wafer chuck 20 is supported on the upper surface of the Zθ stage 17.

The Zθ moving unit 18 includes an elevating mechanism for elevating/lowering the Zθ stage 17, a Z motor for driving the elevating mechanism, a rotating mechanism for rotating the Zθ stage 17 around a rotation axis which is in parallel with the Z-axis and a θ motor for driving the rotating mechanism, for example. The Zθ moving unit 18 moves the wafer chuck 20 supported on the upper surface of the Zθ stage 17 in the Z-axis direction and rotates the wafer chuck 20 around the rotation axis which is in parallel with the Z-axis.

The wafer chuck 20 is supported so that the wafer chuck 20 is freely movable in the XYZ-axis directions and freely rotatable around the rotation axis which is in parallel with the Z-axis using the Zθ stage 17 and the other configurations. The above described Zθ stage 17 and the other configurations function as a relative movement unit configured to move the wafer W supported on the wafer chuck 20 relatively to probe needles 35 in the X-axis direction, the Y-axis direction and the Z-axis direction. Note that the X-axis direction is an example of the first direction and the Y-axis direction is an example of the second direction. The Z-axis direction is an example of the third direction and the θ direction is an example of the fourth direction.

The supports 23 shown in FIG. 2 are provided on the upper surface of the base 12. The supports 23 support the head stage 24 at the position upper than the Y stage 13, the X stage 15 and the Zθ stage 17. Namely, the head stage 24 is fixed to the upper surface of the base 12 using the supports 23.

The card holder 25 is provided on the center portion of the head stage 24. A holding hole 25a is formed on the card holder 25 for holding an outer periphery of the probe card 26. The probe card 26 is inserted into the holding hole 25a of the probe card 26 and supported at a position facing the wafer W using the head stage 24 and the card holder 25. Note that the holding hole 25a is shown in FIG. 1.

The probe card 26 shown in FIG. 1 includes a plurality of probe needles 35 arranged in accordance with the arrangement of the electrode pads 9a of the semiconductor chips 9 to be tested, for example. The card holder 25 and the probe card 26 are replaced in accordance with the kind of the semiconductor chips 9.

The probe card 26 is provided with a connection terminal which is electrically connected to the probe needles 35. A tester is connected to the connection terminal. The tester transmits various test signals to the electrode pads 9a of the semiconductor chips 9 via the connection terminal of the probe card 26 and the probe needle 35 and receives the signals outputted from the electrode pads 9a. The tester analyzes the signal outputted from the electrode pads 9a and tests whether or not the semiconductor chips 9 are normally operated.

Namely, the probe card 26 functions as the test head for supplying the test signals to the semiconductor chips 9 formed on the wafer W. The conventional technologies can be applied to the configuration of the tester and the test method. Here, the detailed explanation of the configuration of the tester and the like is omitted. Note that the illustration of the connection terminal and the tester is omitted.

The wafer alignment camera 29 photographs the semiconductor chips 9 of the wafer W supported by using the wafer chuck 20. The images of the semiconductor chips 9 photographed by using the wafer alignment camera 29 are used for the detection of the position of the electrode pads 9a of the semiconductor chips 9 to be tested. The position of arranging the wafer alignment camera 29 and the configuration of the wafer alignment camera 29 are not particularly limited.

The up-down stage 30 includes the needle alignment camera 31 and the cleaning plate 32. The needle alignment camera 31 and the cleaning plate 32 are arranged to face the probe card 26 and the like. In addition, the up-down stage 30 includes the elevating mechanism for movably supporting the needle alignment camera 31 and the cleaning plate 32 in the Z-axis direction freely.

The up-down stage 30 can operate the elevating mechanism to adjust the position of the needle alignment camera 31 and the cleaning plate 32 in the Z-axis direction. Note that the illustration of the elevating mechanism is omitted.

The needle alignment camera 31 and the cleaning plate 32 are freely movable in the Z-axis direction by the up-down stage 30. In addition, the needle alignment camera 31 and the cleaning plate 32 are freely movable in the Y-axis direction by the Y stage 13 and the Y moving unit 14. In addition, the needle alignment camera 31 and the cleaning plate 32 are freely movable in the X-axis direction by the X stage 15 and the X moving unit 16.

Namely, the needle alignment camera 31, the cleaning plate 32 and the probe needle 35 are relatively movable in the X-axis direction, the Y-axis direction and the Z-axis direction.

The needle alignment camera 31 photographs the probe needle 35 from a lower direction in the Z axis. The images of the probe needle 35 photographed by the needle alignment camera 31 are used for detecting the position of the tip of the probe needle 35. Specifically, the XY coordinates at the position of the tip of the probe needle 35 are detected based on the position coordinate of the needle alignment camera 31. In addition, the Z coordinate at the position of the tip of the probe needle 35 is detected based on the focus position of the needle alignment camera 31.

When the semiconductor chips 9 of the wafer W are tested, the probe card 26 may be replaced. After the probe card 26 is replaced, the position of the tip of the probe needle 35 is detected. It is also possible to detect the position of the tip of the probe needle 35 each time after a predetermined number of tests of the semiconductor chips 9 is performed.

A non-limiting example of the procedures of detecting the position of the tip of the probe needle 35 is as follows. First, the needle alignment camera 31 is moved to the photographing position where the tip of the probe needle 35 to be photographed. Then, the tip portion of the probe needle 35 is photographed by using the needle alignment camera 31. Then, the position of the tip of the probe needle 35 is detected based on the image of the tip portion of the probe needle 35. Note that "tip portion" of the probe needle 35 to be photographed may include a specific part (e.g., mark for detecting the tip) of the probe needle 35 having a clear position relation with the tip in addition to the tip itself of the probe needle 35. The same is applied to the case of "image of tip portion." The image of the tip portion includes the image of the specific part in addition to the image of the tip itself. Namely, the needle alignment camera 31 can acquire the image of a specific part of the probe needle 35 as "image of tip portion" instead of (or together with) the image of the tip itself. In addition, the position of the tip can be obtained from the image of the tip itself while it can be obtained from the specific part instead of (or together with) the image of the tip itself.

In addition, when the semiconductor chips 9 of the wafer W are tested, the positions of the electrode pads 9a of the semiconductor chips 9 in the wafer W are also detected. Note that the wafer W to be tested is supported by using the wafer chuck 20.

A non-limiting example of the procedures of detecting the positions of the electrode pads 9a is as follows. First, the electrode pads 9a of the semiconductor chips 9 formed on the wafer W are moved to the photographing position of the wafer alignment camera 29. Then, the electrode pads 9a are photographed by using the wafer alignment camera 29. Then, the positions of the electrode pads 9a are detected based on the image of the electrode pads 9a.

After the positions are detected, the probe needle 35 is electrically contacted with the electrode pad 9a of the semiconductor chips 9 of the first test object.

After that, the wafer W is moved and the probe needle 35 is electrically contacted with the next electrode pad 9a of the semiconductor chips 9 sequentially to perform the test. The above described procedure is repeated to perform the test of a plurality of semiconductor chips 9 to be tested. It is also possible to contact a plurality of probe needles 35 with a plurality of electrode pads 9a so that the test of a plurality of semiconductor chips 9 is performed simultaneously.

A cleaning, a polishing and the like of the tip of the probe needle 35 are appropriately performed by using the cleaning plate 32.

As for the specific test method of the semiconductor chips 9, the conventional test methods such as the test method described in Japanese Unexamined Patent Application Publication No. 2018-117095 can be applied, for example. Here, the detailed explanation of the test method of the semiconductor chips 9 is omitted.

[Example of Electrical Configuration of First Embodiment of Prober]

Figure 4:
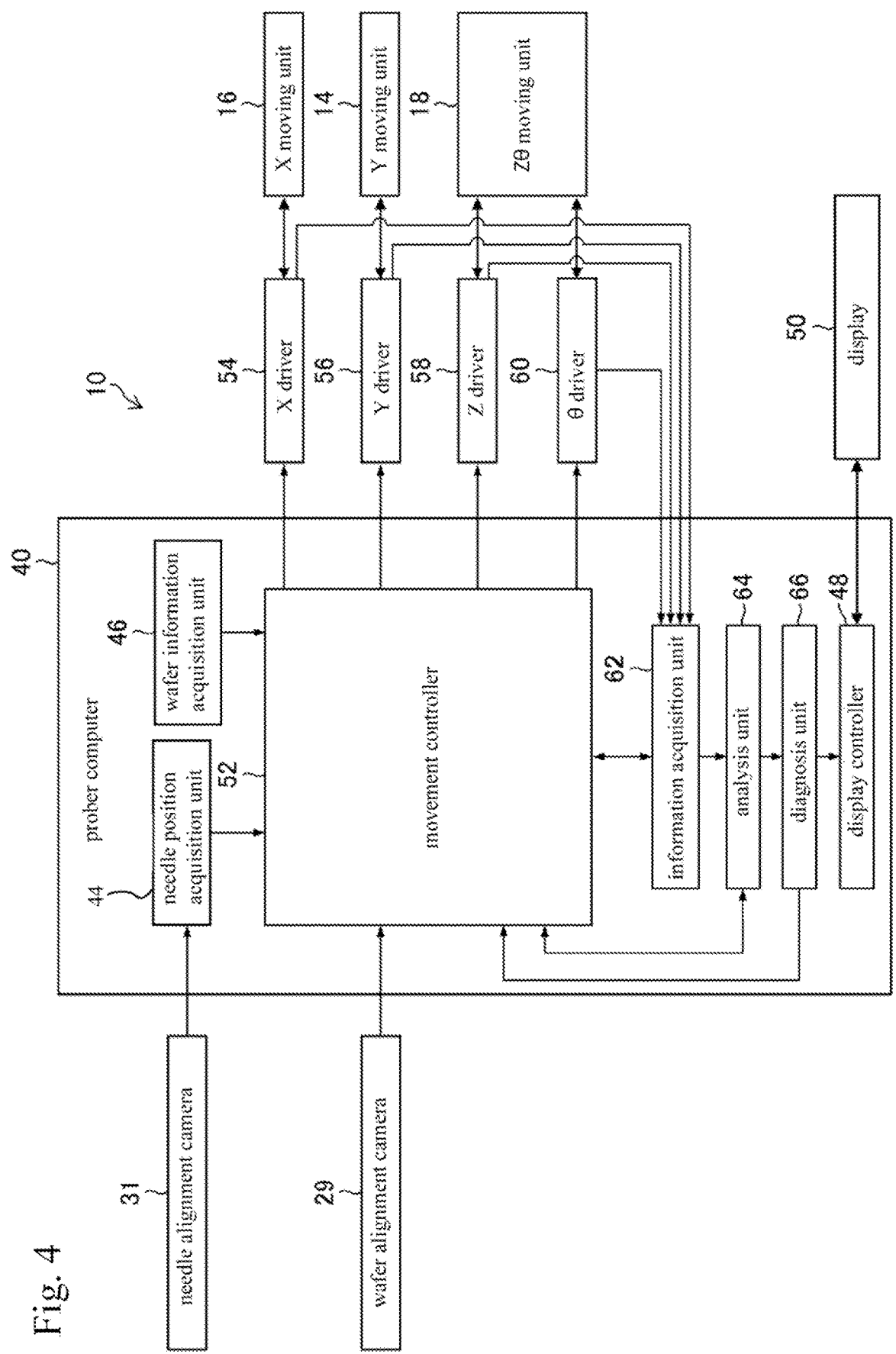
FIG. 4 is a functional block diagram showing an electrical configuration of the first embodiment of the prober.

FIG. 4 is a functional block diagram showing an electrical configuration of the first embodiment of the prober. FIG. 4 mainly illustrates the elements related to the movement control of the wafer chuck 20. The illustration of the elements related to the other functions is omitted appropriately.

A prober computer 40 functions as the control device for collectively controlling each part of the prober 10. The prober computer 40 executes various programs corresponding to the function of each part of the prober 10 to achieve the function of each part of the prober 10. The prober computer 40 can be arranged on the body of the prober 10 or arranged outside the prober 10.

The type of the computer applied to the prober computer 40 can be a server, a personal computer, a work station, a tablet terminal or the like. The type of the computer applied to the prober computer 40 can be a virtual machine.

The various programs can be stored in a memory device provided on the prober computer 40 or stored in a memory device provided on an outside of the prober computer 40 and an inside of the prober 10. It is also possible for the prober computer 40 to acquire the various programs from the memory device of the outside of the prober 10.

The prober computer 40 includes an arithmetic circuit comprising various processors, memories and the like. CPU (Central Processing Unit), GPU (Graphics Processing Unit), ASIC (Application Specific Integrated Circuit), programmable logic device and the like can be examples of the various processors.

SPLD (Simple Programmable Logic Devices), CPLD (Complex Programmable Logic Device), FPGA (Field Programmable Gate Arrays) and the like can be examples of the programmable logic device. Various functions of the prober computer 40 can be achieved by using one processor or using a plurality of processors. The plurality of processors can be the same kind of plurality of processors or different kinds of plurality of processors from each other.

The prober computer 40 includes various communication interfaces. The prober computer 40 is freely communicably connected to peripheral devices such as the wafer alignment camera 29 and the needle alignment camera 31 via the various communication interfaces. Various standards such as USB can be applied to the communication interfaces. Both wired communication and wireless communication can be applied to the communication mode of the communication interfaces. Note that USB is an abbreviated word of Universal Serial Bus. In addition, USB is the registered trademark.

The prober computer 40 includes a needle position acquisition unit 44. The needle position acquisition unit 44 acquires the images of the tip of the probe needle 35 outputted from the needle alignment camera 31. The needle position acquisition unit 44 acquires the information of the position of the tip of the probe needle 35 from the images of the tip portion of the probe needle 35. The acquisition of the information includes the concept of generating the desired data by processing the original information.

The prober computer 40 includes a wafer information acquisition unit 46. The wafer information acquisition unit 46 acquires the wafer information which is referred to when identifying the type of the wafer W to be tested. The wafer information includes the information of the type of the semiconductor chips 9 formed on the wafer W.

The prober computer 40 includes a display controller 48. The display controller 48 transmits the display signals indicating various information in the prober 10 to a display 50. The display 50 displays the various information in the prober 10. Various displays such as a liquid crystal display are applied to the display 50. A touch-panel type display can be applied to the display 50. In this case, the display 50 can be integrally formed with the input device for inputting various information to the prober computer 40.

The prober computer 40 includes a movement controller 52. The movement controller 52 transmits the operation instruction to an X driver 54, a Y driver 56, a Z driver 58 and a θ driver 60. Namely, the movement controller 52 functions as the operation instruction transmission unit for transmitting the operation instruction to motor driving devices such as the X driver 54. The movement controller 52 executes an operation instruction transmission step and achieves an operation instruction transmission function.

The X driver 54 controls the operation of the X motor provided on the X moving unit 16 based on the operation instruction transmitted from the movement controller 52 to the X moving unit 16. The Y driver 56 controls the operation of the Y motor provided on the Y moving unit 14 based on the operation instruction transmitted from the movement controller 52 to the Y moving unit 14. The Z driver 58 controls the operation of the Z motor provided on the Zθ moving unit 18 based on the operation instruction transmitted from the movement controller 52 to the elevating mechanism provided on the Zθ moving unit 18.

Figure 5:
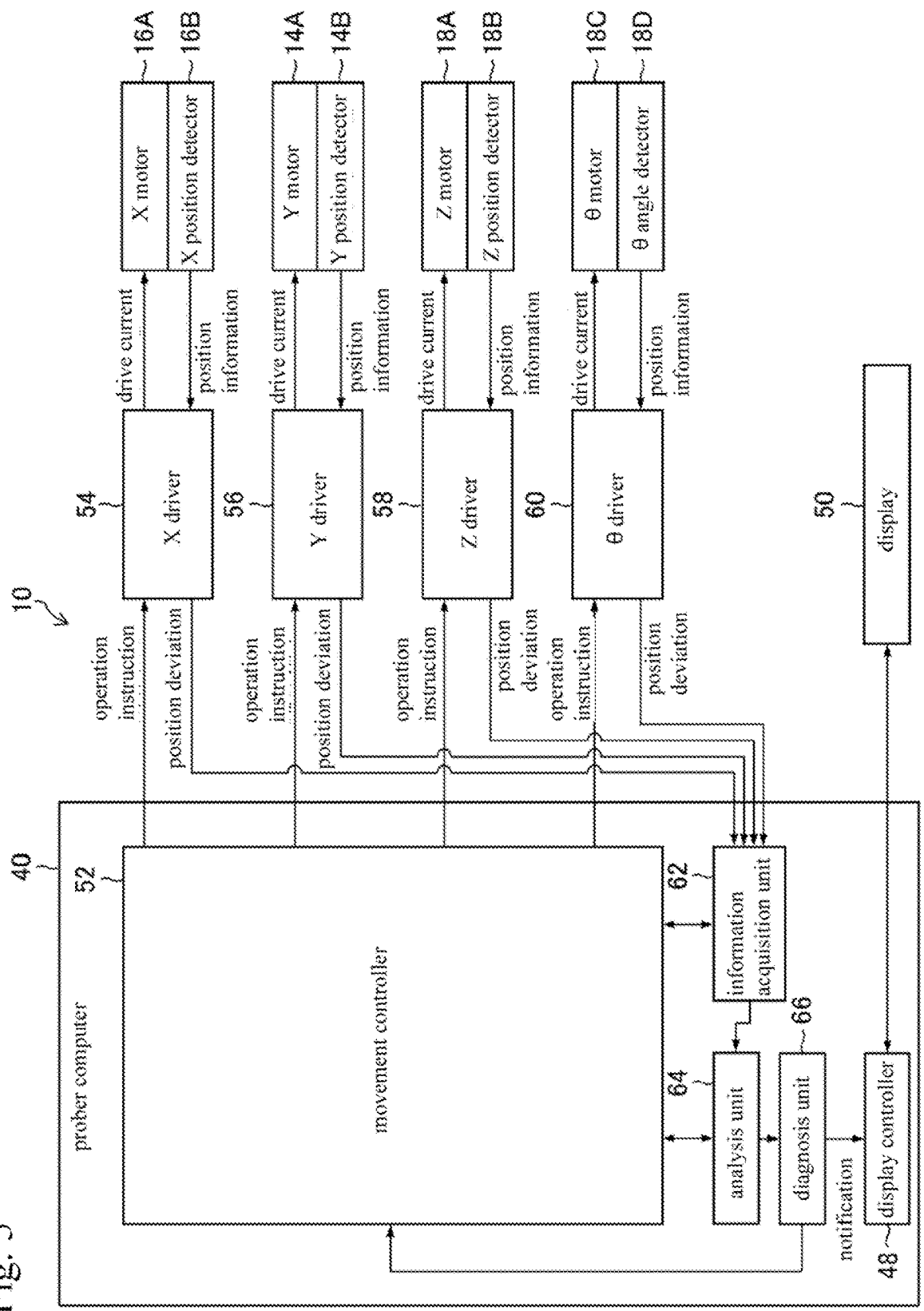
FIG. 5 is a functional block diagram extracting a part of the electrical configuration shown in FIG. 4.

The θ driver 60 controls the operation of the θ motor provided on the Zθ moving unit 18 based on the operation instruction transmitted from the movement controller 52 to the rotating mechanism provided on the Zθ moving unit 18. Note that the illustration of the X motor, the Y motor, the Z motor and the θ motor is omitted in FIG. 4. The X motor, the Y motor, the Z motor and the θ motor are illustrated in FIG. 5.

The movement controller 52 acquires the position of the semiconductor chips 9 (electrode pads 9a) from the images of the semiconductor chips 9 to be tested transmitted from the wafer alignment camera 29. In addition, the movement controller 52 acquires the information of the position of the tip of the probe needle 35 from the needle position acquisition unit 44.

When the test of the wafer W is performed, the movement controller 52 controls the operation of the X moving unit 16, the Y moving unit 14 and the Zθ moving unit 18 to relatively move the wafer W with respect to the probe needle 35 so that the semiconductor chips 9 to be tested are sequentially (simultaneously) contacted with the probe needle 35.

The prober computer 40 includes an information acquisition unit 62. In a state that the wafer W and the probe needle 35 are in contact with each other, the information acquisition unit 62 acquires the position deviation information including the position deviation of the wafer chuck 20 in the X-axis direction, the Y-axis direction and the Z-axis direction from the X driver 54, the Y driver 56 and the Z driver 58 respectively. In addition, in a state that the wafer W and the probe needle 35 are in contact with each other, the information acquisition unit 62 acquires the rotation angle deviation information related to the rotation angle deviation of the wafer chuck 20 from the θ driver 60. Note that the rotation angle deviation information can be used as the position deviation information.

Here, the state that the wafer W and the probe needle 35 are in contact with each other is the state that the wafer chuck 20 is moved in at least one of the X-axis direction, the Y-axis direction, the Z-axis direction and the θ direction based on the operation instruction and the wafer chuck 20 is positioned and stopped at a predetermined position. The state that the wafer chuck 20 is positioned and stopped is the state that the semiconductor chip 9 to be tested of the wafer W and the probe needle 35 are positioned. The above described state is recognized as the period of performing the test of the semiconductor chip 9 to be tested, for example. The information acquisition unit 62 performs the information acquisition step and achieves the information acquisition function.

The prober computer 40 includes an analysis unit 64. The analysis unit 64 analyzes the position deviation information of the wafer chuck 20 in the X-axis direction, the Y-axis direction and the Z-axis direction acquired by using the information acquisition unit 62. The analysis unit 64 can analyze the rotation angle deviation information of the wafer chuck 20 in the θ direction by using the information acquisition unit 62.

For example, the analysis unit 64 can store the position deviation acquired in time series in that order. The analysis unit 64 can generate the position deviation history for each direction from the position deviation of each direction acquired in time series. The analysis unit 64 performs the analysis step and achieves the analysis function.

The prober computer 40 includes a diagnosis unit 66. The diagnosis unit 66 determines whether or not the abnormal operation of the X moving unit 16 occurs in a state that the wafer W and the probe needle 35 are in contact with each other (state of being positioned and stopped) based on the analysis result of the position deviation information of the wafer chuck 20 in the X-axis direction.

The diagnosis unit 66 determines whether or not the abnormal operation of the Y moving unit 14 occurs in the state that the wafer W and the probe needle 35 are in contact with each other (state of being positioned and stopped) based on the analysis result of the position deviation information of the wafer chuck 20 in the Y-axis direction.

The diagnosis unit 66 determines whether or not the abnormal operation of the elevating mechanism of the Zθ moving unit 18 occurs in the state that the wafer W and the probe needle 35 are in contact with each other (state of being positioned and stopped) based on the analysis result of the position deviation information of the wafer chuck 20 in the Z-axis direction.

The diagnosis unit 66 determines whether or not the abnormal operation of the rotating mechanism of the Zθ moving unit 18 occurs in the state that the wafer W and the probe needle 35 are in contact with each other (state of being positioned and stopped) based on the analysis result of the rotation angle deviation information of the wafer chuck 20 in the θ-axis direction.

When it is determined that the abnormal operation occurs in at least one of the X moving unit 16, the Y moving unit 14, the elevating mechanism of the Zθ moving unit 18 and the rotating mechanism of the Zθ moving unit 18, the diagnosis unit 66 transmits the abnormality determination information indicating the determination result to the movement controller 52.

When the abnormality determination information is acquired, the movement controller 52 drives the elevating mechanism of the Zθ moving unit 18 to lower (descend) the wafer chuck 20 so that the contact between the wafer W and the probe needle 35 is solved (eliminated) and the wafer W is retreated to the position of avoiding the damage of the wafer W, the probe card 26 and the like.

When the abnormality determination information is acquired, the diagnosis unit 66 transmits the information indicating the abnormality determination information to the display controller 48. The display controller 48 displays the abnormality determination information on the display 50. The abnormality determination information can be displayed as the character information, for example. Note that the diagnosis unit 66 described in the embodiment is an example of the determination unit configured to determine an existence or absence of an occurrence of an abnormal operation of the movement mechanism based on an analysis result of the position deviation information. The diagnosis unit 66 performs the determination step and achieves the determination function.

FIG. 5 is a functional block diagram extracting a part of the electrical configuration shown in FIG. 4. FIG. 5 illustrates the X moving unit 16, the Y moving unit 14 and the Zθ moving unit 18 shown in FIG. 4 and the motors and the detectors provided on each of them.

The X moving unit 16 shown in FIG. 4 includes an X motor 16A and an X position detector 16B shown in FIG. 5. The Y moving unit 14 includes a Y motor 14A and a Y position detector 14B. The Zθ moving unit 18 includes a Z motor 18A, a Z position detector 18B, a θ motor 18C and a 0 angle detector 18D.

The X driver 54 which is the driving unit of the X motor 16A supplies the drive current to the X motor 16A and controls the operation of the X motor 16A based on the operation instruction transmitted from the movement controller 52. Specifically, the X driver 54 operates the X motor 16A in accordance with the rotation angle instruction of the X motor 16A indicated by the operation instruction and performs the positioning of the X stage 15 shown in FIG. 1.

The X motor 16A includes the X position detector 16B. As for the X position detector 16B, an encoder mounted on the rotation axis of the X motor 16A is applied. The X position detector 16B to which the encoder is applied outputs the pulse signal having the frequency corresponding to the rotation speed of the X motor 16A and having the number of pulses depending on the rotation angle of the X motor 16A. The encoder can output the two-phase analog signal in a state that the phases are dislocated by a half wavelength.

The X position detector 16B can be a linear scale for detecting the position of the X stage 15. The X position detector 16B to which the linear scale is applied outputs the signal indicating the position of the X stage 15. A digital signal of 2 bits or more can be an example of the signal indicating the position. The position of the X stage 15 is recognized as the position of the wafer chuck 20 in the X direction.

The X driver 54 acquires the output signal of the X position detector 16B, calculates the position deviation of the X stage 15 in the X-axis direction from the output signal of the X position detector 16B and the operation instruction in the X-axis direction, and controls the rotation angle of the X motor 16A based on the position deviation of the X stage 15 in the X-axis direction.

In the state that the wafer W and the probe needle 35 are in contact with each other (state of being positioned and stopped), the information acquisition unit 62 acquires the position deviation of the X stage 15 outputted from the X driver 54. The position deviation of the X stage 15 is recognized as the position deviation of the wafer chuck 20 in the X direction.

The analysis unit 64 analyzes the position deviation of the X stage 15 in the X-axis direction acquired by using the information acquisition unit 62. The diagnosis unit 66 determines an existence or absence of the abnormal operation of the X stage 15 based on the analysis result of the analysis unit 64. The existence or absence of the abnormal operation of the X stage 15 is recognized as the existence or absence of the abnormal operation of the wafer chuck 20 in the X-axis direction.

When the diagnosis unit 66 determines that the abnormal operation of the X stage 15 occurs, the diagnosis unit 66 transmits the signal indicating the occurrence of the abnormal operation of the X stage 15 to the movement controller 52. When the movement controller 52 acquires the signal indicating the occurrence of the abnormal operation of the X stage 15, the movement controller 52 performs a retreat movement of the wafer chuck 20 shown in FIG. 1.

Specifically, the movement controller 52 transmits the operation instruction for lowering the wafer chuck 20 to the Z driver 58 as the operation instruction of the retreat movement of the wafer chuck 20. The Z driver 58 lowers the wafer chuck 20 to separate the wafer W and the probe needle 35 from each other so that the contact between the wafer W and the probe needle 35 is solved.

When the diagnosis unit 66 determines that the abnormal operation of the X stage 15 occurs, the diagnosis unit 66 notifies the occurrence of the abnormal operation of the X stage 15 to the display controller 48. The display controller 48 displays the information indicating the occurrence of the abnormal operation of the X stage 15 on the display 50.

The Y driver 56, the Z driver 58 and the θ driver 60 control the operation of the Y motor 14A, the Z motor 18A and the θ motor 18C respectively based on the operation instruction transmitted from the movement controller 52.

The Y driver 56 which is the driving unit of the Y motor 14A and the Z driver which is the driving unit of the Z motor 18A acquire the position of the wafer chuck 20 in the Y direction and the Z direction from the Y position detector 14B and the Z position detector 18B respectively, calculate the position deviation based on the position information of the wafer chuck 20 in each direction and output the position deviation. The position of the wafer chuck 20 can be the coordinate value or the position vector. The θ driver 60 which is the driving unit of the θ motor 18C acquires the angle information including the rotation angle of the wafer chuck 20 from the θ angle detector 18D, calculates the angle deviation based on the angle information and outputs the angle deviation.

The information acquisition unit 62 acquires the position deviation information including the position deviation of the wafer chuck 20 in each direction. The analysis unit 64 analyzes the position deviation information of the wafer chuck 20 in each direction. The diagnosis unit 66 determines the existence or absence of the abnormal operation of the Y stage 13, the elevating mechanism of the Zθ stage 17 and the rotating mechanism of the Zθ stage 17 based on the analysis result of the analysis unit 64. The abnormal operation of the Y stage 13, the elevating mechanism of the Zθ stage 17 and the rotating mechanism of the Zθ stage 17 is recognized as the existence or absence of the abnormal operation of the wafer chuck 20 in each of the Y-axis direction, the Z-axis direction and the θ-axis direction.

When the abnormal operation occurs in at least one of the Y stage 13, the elevating mechanism of the Zθ stage 17 and the rotating mechanism of the Zθ stage 17, the diagnosis unit 66 transmits the signal indicating the occurrence of the abnormal operation to the movement controller 52. When the movement controller 52 acquires the signal indicating the occurrence of the abnormal operation, the movement controller 52 performs the retreat movement of the wafer chuck 20. When the movement controller 52 acquires the signal indicating the occurrence of the abnormal operation, the movement controller 52 displays the information indicating the occurrence of the abnormal operation on the display 50.

As for the X motor 16A, the Y motor 14A, the Z motor 18A and the θ motor 18C shown in FIG. 5, a servo motor is applied. As for the X driver 54, the Y driver 56, the Z driver 58 and the θ driver 60, a servo driver is applied.

Figure 6:
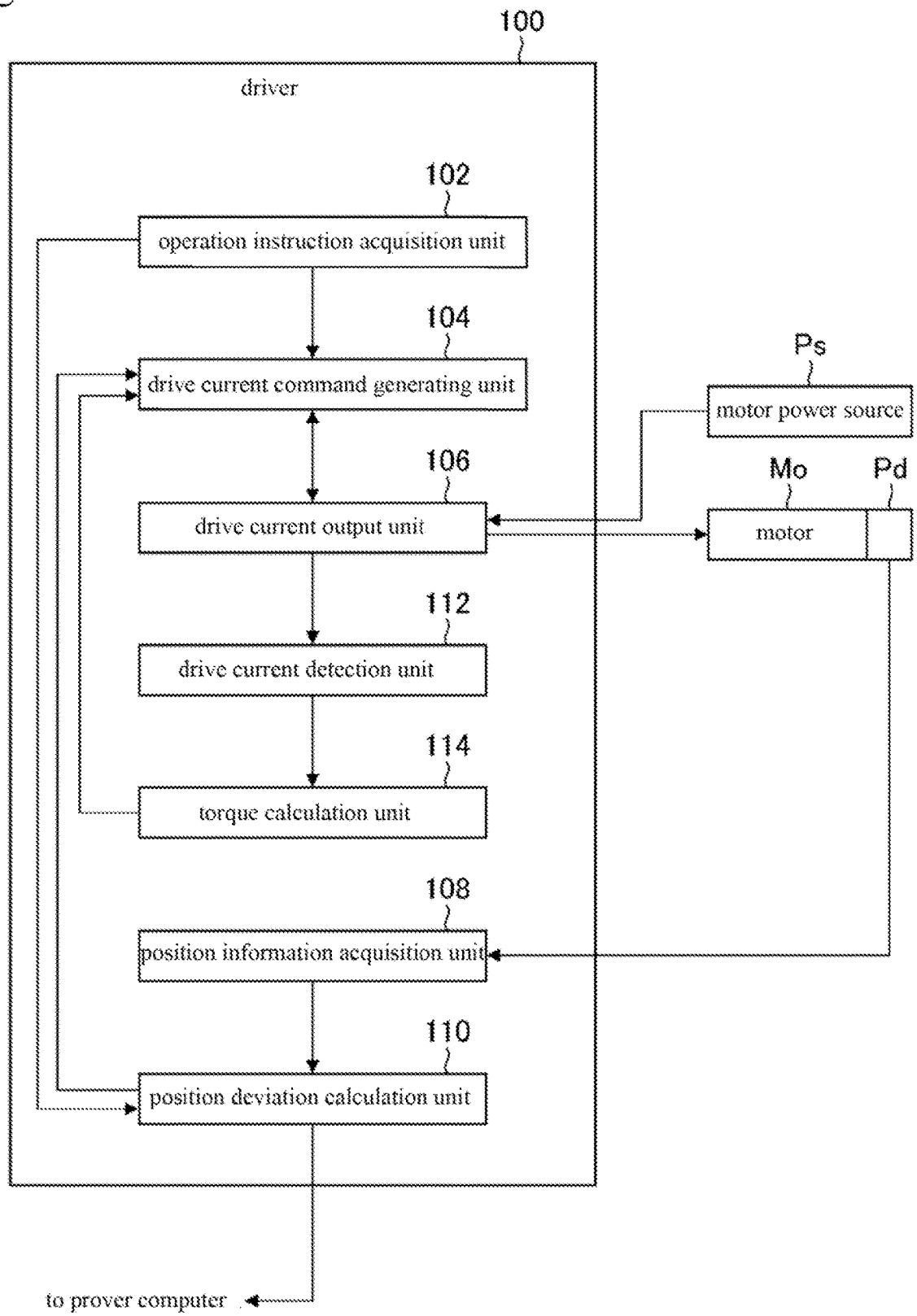
FIG. 6 is a functional block diagram showing an electrical configuration of a driver shown in FIG. 5.

FIG. 6 is a functional block diagram showing an electrical configuration of the driver shown in FIG. 5. The similar configuration is applied to the X driver 54, the Y driver 56, the Z driver 58 and the θ driver 60 (also referred to as the X driver 54 and the like) shown in FIG. 4. Here, the X driver 54 and the like are illustrated as a driver 100. In FIG. 6, the X motor 16A, the Y motor 14A, the Z motor 18A and the θ motor 18C are illustrated as a motor Mo. In addition, the wafer chuck 20 shown in FIG. 1 is moved in one direction in accordance with the operation of the motor Mo.

The driver 100 shown in FIG. 6 includes an operation instruction acquisition unit 102. The operation instruction acquisition unit 102 acquires the operation instruction transmitted from the movement controller 52 of the prober computer 40 shown in FIG. 5.

The driver 100 includes a drive current command generating unit 104. The drive current command generating unit 104 generates a drive current command signal which is a command signal of the drive current supplied to the motor Mo based on the operation instruction. The drive current command signal defines the magnitude of the drive current and the supply timing of the drive current supplied to the motor Mo.

The driver 100 includes a drive current output unit 106. Electric power is supplied from a motor power source Ps to the drive current output unit 106. The drive current output unit 106 outputs the drive current supplied to each phase of the motor Mo based on the drive current command signal. The motor Mo operates based on the drive current command signal.

The driver 100 includes a position information acquisition unit 108. The position information acquisition unit 108 acquires the position information from a position detector Pd. The position detector Pd can acquire the encoder signal indicating the rotation speed and the rotation angle of the motor Mo, calculate the position of the wafer chuck 20 based on the encoder signal, and output the signal indicating the position of the wafer chuck 20 as the position information. The position information acquisition unit 108 can acquire the encoder signal outputted from the position detector Pd and calculate the position of the wafer chuck 20 based on the outputted encoder signal.

The driver 100 includes a position deviation calculation unit 110. The position deviation calculation unit 110 calculates the position deviation of the wafer chuck 20 from the position information including the actual position of the wafer chuck 20 acquired by using the position information acquisition unit 108 and the operation instruction acquired by using the operation instruction acquisition unit 102. The drive current command generating unit 104 generates the drive current command signal based on the position deviation of the wafer chuck 20 and transmits the drive current command signal to the drive current output unit 106. The drive current output unit 106 operates the motor Mo based on the drive current command signal and performs the positioning of the wafer chuck 20. In addition, the position deviation calculation unit 110 transmits the position deviation information of the wafer chuck 20 to the information acquisition unit 62 of the prober computer 40.

The driver 100 includes a drive current detection unit 112. The drive current detection unit 112 detects the drive current outputted from the drive current output unit 106 to the motor Mo. The drive current detection unit 112 can detect the drive current outputted to the motor Mo by using a current sensor or detect the drive current outputted to the motor Mo by using a current circuit such as a current detection circuit.

The driver 100 includes a torque calculation unit 114. The torque calculation unit 114 calculates a generation torque of the motor Mo based on the drive current of the motor Mo detected by using the drive current detection unit 112. When executing the torque control of the motor Mo, the generation torque of the motor Mo calculated by using the torque calculation unit 114 is applied to the control of the drive current supplied to the motor Mo.

[Concrete Example of Determination of Abnormal Operation]

Figure 7:
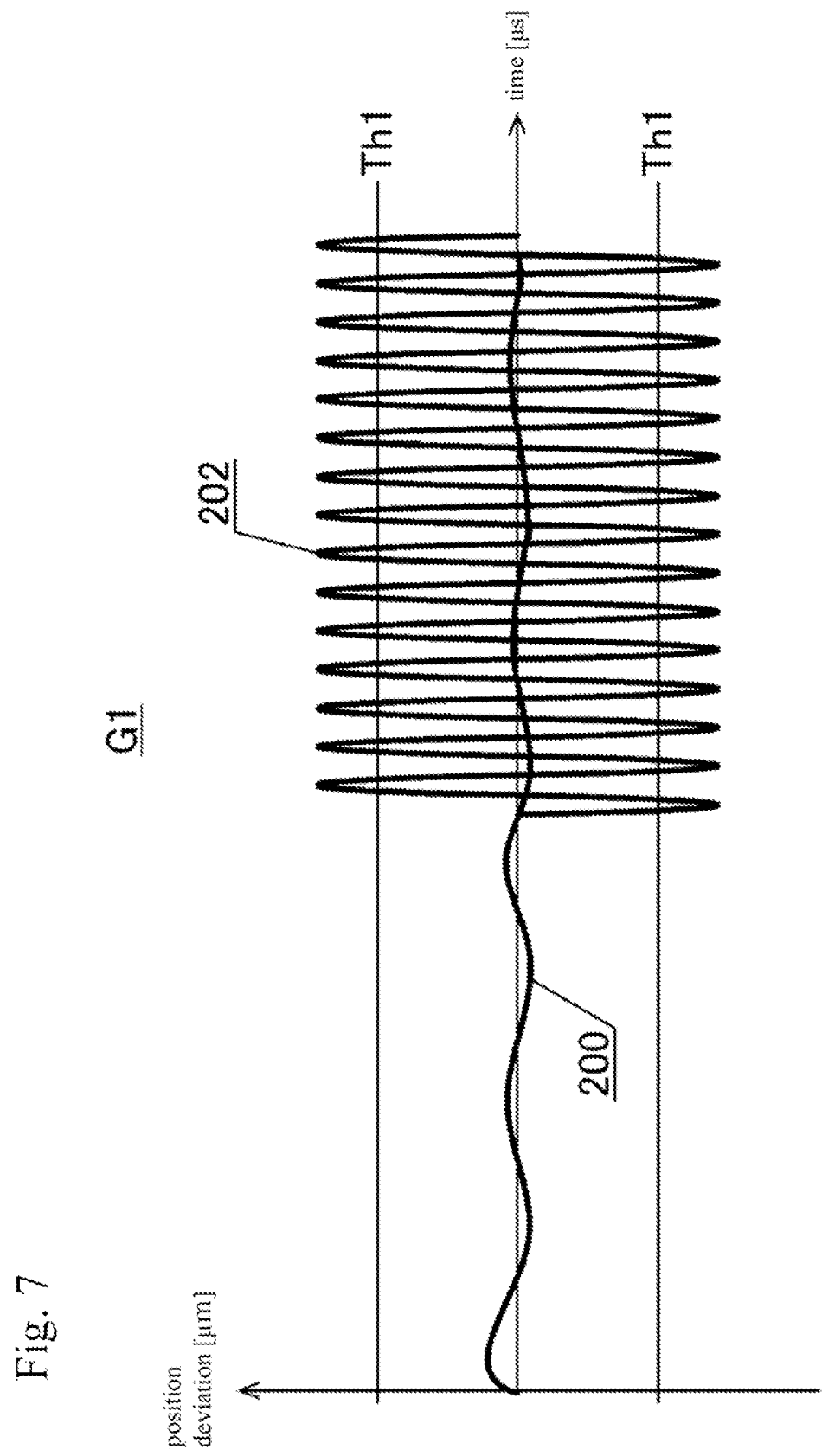
FIG. 7 is a graph showing a temporal change of a position deviation indicating an example of an abnormal state.

FIG. 7 is a graph showing a temporal change of a position deviation indicating an example of the abnormal state. The first graph G1 shown in FIG. 7 indicates the temporal change of the position deviation in the X-axis direction of the wafer chuck 20 in the state that the wafer W and the probe needle 35 are in contact with each other (state of being positioned and stopped). The horizontal axis of the first graph G1 is the time. A unit of the time is a microsecond (μs). The vertical axis of the first graph G1 is the position deviation. A unit of the position deviation is a micrometer (μm).

A first position deviation waveform 200 indicates the temporal change of the position deviation of the wafer chuck 20 under a normal condition. When the wafer chuck 20 is under a normal condition, the position deviation of the wafer chuck 20 positioned at a predetermined position is within a predetermined range.

A second position deviation waveform 202 indicates the temporal change of the position deviation of the wafer chuck 20 in the abnormal state where the position deviation of the wafer chuck 20 exceeds a predetermined first threshold value Th1 and the waveform oscillates. The first threshold value Th1 illustrated in FIG. 7 is set to both the positive position deviation side and the negative position deviation side with respect to the reference value of the position deviation. Different magnitudes of the values can be set to the first threshold value Th1 between the positive position deviation side and the negative position deviation side. This can be also applied to the later described second threshold value and third threshold value Th3.

Namely, the analysis unit 64 shown in FIG. 5 applies a predetermined sampling period and stores a plurality of position deviations acquired in time series in the acquired order. The analysis unit 64 can generate the history of the position deviation illustrated in FIG. 7 as the first graph G1. The diagnosis unit 66 determines whether or not the position deviation exceeds the predetermined first threshold value Th1 based on the analysis result of the analysis unit 64. When the position deviation of the wafer chuck 20 exceeds the first threshold value Th1, the diagnosis unit 66 determines that the abnormal operation of the wafer chuck 20 occurs.

The analysis unit 64 can perform a frequency analysis processing on a plurality of position deviations. The diagnosis unit 66 can determine the existence or absence of the mechanical damage of the wafer chuck 20 and the like based on the variation of the frequency included in the time-series variation of the position deviation. As for the frequency analysis processing, Fast Fourier Transform called FFT can be applied. Note that FFT is an abbreviated word of Fast Fourier Transform.

Figure 8:
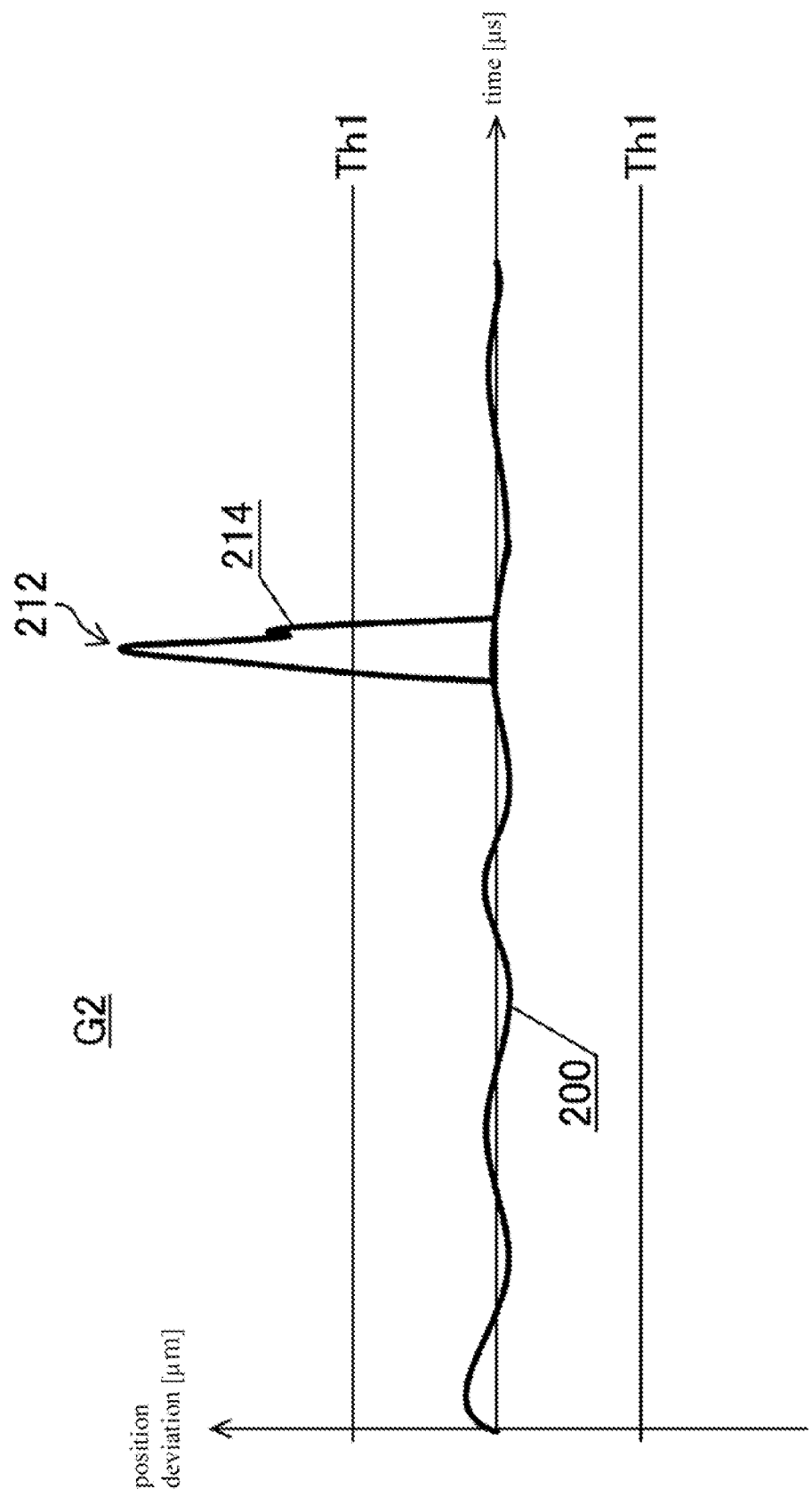
FIG. 8 is a graph showing a temporal change of a position deviation indicating another example of an abnormal state.

FIG. 8 is a graph showing a temporal change of a position deviation indicating another example of an abnormal state. The second graph G2 shown in FIG. 8 indicates the temporal change of the position deviation in the X-axis direction of the wafer chuck 20 in a state that the wafer W and the probe needle 35 are in contact with each other. The horizontal axis of the second graph G2 is the time. A unit of the time is a microsecond (μs). The vertical axis of the second graph G2 is the position deviation. A unit of the position deviation is a micrometer (μm). Same as the first graph G1 shown in FIG. 7, the first position deviation waveform 200 indicates the temporal change of the position deviation of the wafer chuck 20 under a normal condition.

A third position deviation waveform 212 in the second graph G2 shown in FIG. 8 indicates the temporal change of the position deviation of the wafer chuck 20 in the abnormal state where the position deviation of the wafer chuck 20 exceeds the predetermined first threshold value Th1. The third position deviation waveform 212 includes a waveform element 214 where the position deviation of the wafer chuck 20 exceeds the predetermined first threshold value Th1.

Namely, it is determined that the abnormal operation of the wafer chuck 20 occurs when a plurality of position deviations acquired by applying the predetermined sampling period exceeds the predetermined first threshold value Th1 one or more times.

The determination of the abnormal operation shown in FIG. 7 and FIG. 8 can be applied to any of the X-axis direction, the Y-axis direction, the Z-axis direction and the θ direction of the wafer chuck 20. The threshold value in each direction of the wafer chuck 20 can be appropriately defined in accordance with the accuracy required for the determination of the abnormal operation.

First Modified Example

As described above, the embodiment of acquiring the position deviation of each direction of the wafer chuck 20 from the driver 100 controlling the motor Mo of each direction is exemplified in the first embodiment. On the other hand, in the first modified example, instead of the driver 100 (FIG. 6), the prober computer 40 shown in FIG. 5 and the other figures includes the position information acquisition unit 108 and the position deviation calculation unit 110. Namely, in the first modified example, the prober computer 40 can acquire the position information in each direction of the wafer chuck 20, calculate the position deviation in each direction of the wafer chuck 20 using the operation instruction and the position information and acquire the position deviation in each direction of the wafer chuck 20.

Second Modified Example

As described above, the embodiment of determining whether or not the abnormal operation occurs in the X-axis direction, the Y-axis direction, the Z-axis direction and the θ direction of the wafer chuck 20 is exemplified in the first embodiment. On the other hand, in the second modified example, any one of the X-axis direction, the Y-axis direction, the Z-axis direction and the θ direction is excluded from the object of the determination of the abnormal operation. For example, the direction of performing an open loop control without having the position detector Pd shown in FIG. 6 can be excluded from the object of the determination of the abnormal operation.

Operation and Effect of First Embodiment

The following operation and effect can be obtained by the first embodiment of the prober.

[1]

In the state that the wafer W and the probe needle 35 are in contact with each other, the position deviation information including the position deviation between the position in the operation instruction and the actual position in the position information is acquired in each of the X-axis direction, the Y-axis direction, the Z-axis direction and the θ direction of the wafer chuck 20. The position deviation information is analyzed and the existence or absence of the occurrence of the abnormal operation of the wafer chuck 20 is determined based on the analysis result of the position deviation information. Consequently, in the state that the wafer W and the probe needle 35 are in contact with each other, the occurrence of the abnormal operation of the wafer chuck 20 can be recognized.

[2]

When the position deviation of the wafer chuck 20 exceeds the first threshold value Th1, it is determined that the abnormal operation of the wafer chuck 20 occurs.

Consequently, the occurrence of the abnormal operation of the wafer chuck 20 can be recognized by applying the determination of the threshold value with respect to the position deviation of the wafer chuck 20.

[3]

When it is determined that the abnormal operation of the wafer chuck 20 occurs, the wafer chuck 20 is lowered to solve the contact between the wafer W and the probe needle 35. Consequently, the damage of the wafer W, the probe card 26 and the like due to the abnormal operation of the wafer chuck 20 can be suppressed.

[4]

When it is determined that the abnormal operation of the wafer chuck 20 occurs, the occurrence of the abnormal operation of the wafer chuck 20 is notified. Consequently, the operator can recognize the occurrence of the abnormal operation of the wafer chuck 20 and the operator can cope with the damage of the wafer W, the probe card 26 and the like.

[5]

A plurality of position deviations is acquired in time series in the predetermined sampling period. The frequency analysis processing is performed with respect to a plurality of position deviations acquired in time series. Consequently, the operator can recognize the occurrence of the mechanical abnormality of the wafer chuck 20, the wafer W and the probe card 26 based on the variation of the frequency in the time-series variation of the position deviation.

Second Embodiment of Prober

In the second embodiment of the prober, the function of detecting the abnormal operation during the operation of the wafer chuck 20 is added with respect to the first embodiment.

In general, the position deviation of the wafer chuck 20 becomes large when the wafer chuck 20 is operated compared to the state that the wafer W and the probe needle 35 are in contact with each other (state of being positioned and stopped). Consequently, the determination of the occurrence of the abnormal operation of the wafer chuck 20 based on the position deviation of the wafer chuck 20 may become difficult.

In addition, even in the contact state, when the first threshold value Th1 which is the value determined to be abnormal in the position deviation cannot be set large enough, the determination of the occurrence of the abnormal operation of the wafer chuck 20 based on the position deviation of the wafer chuck 20 may become difficult.

Therefore, in the second embodiment, the torque information including the magnitude of the generation torque of the motor in each direction is acquired and the existence or absence of the occurrence of the abnormal operation of the wafer chuck 20 is determined based on the analysis result of the torque information when the wafer chuck 20 is operated. The configurations shown in FIG. 1 to FIG. 4 can be applied to the second embodiment of the prober. Accordingly, the explanation of the entire configuration of the second embodiment is omitted.

The X driver 54 shown in FIG. 5 transmits the torque information including the magnitude of the generation torque of the X motor 16A calculated by using the torque calculation unit 114 (shown in FIG. 6) to the information acquisition unit 62 of the prober computer 40.

The information acquisition unit 62 transmits the acquired torque information to the analysis unit 64. The analysis unit 64 analyzes the torque information. When the magnitude of the generation torque of the X motor 16A exceeds a predetermined second threshold value based on the analysis result of the torque information, the diagnosis unit 66 determines that the abnormal operation of the wafer chuck 20 occurs in the X-axis direction. When the abnormal operation of the wafer chuck 20 occurs in the X-axis direction, the movement controller 52 transmits the operation instruction for lowering the wafer chuck 20 to the Z driver 58 for solving the contact state between the wafer W and the probe needle 35.

Same as the X driver 54, the torque information including the magnitude of the generation torque of the motor of each direction is transmitted to the information acquisition unit 62 also in the Y driver 56, the Z driver 58 and the θ driver 60 shown in FIG. 5. The diagnosis unit 66 determines the existence or absence of the occurrence of the abnormal operation of the wafer chuck 20 in each direction based on the analysis result of the torque information of each direction.

When the abnormal operation of the wafer chuck 20 occurs in one of the directions, the movement controller 52 transmits the operation instruction for lowering the wafer chuck 20 to the Z driver 58 to move the wafer W far from the probe needle 35.

During the operation of the wafer chuck 20, when the load applied on the motor in each direction is increased due to the increase of mechanical friction or the like, the generation torque of the motor in each direction increases. When the generation torque of the motor in each direction exceeds a predetermined range, there is suspicion of the abnormal operation of the motor in each direction. This phenomenon is realized as the occurrence of the abnormal operation of the wafer chuck 20. The increase of the generation torque of the motor is realized as the increase of the drive current of the motor. Namely, even when the driver 100 without having the torque calculation unit 114 shown in FIG. 6 is applied to the control of the motor Mo, the occurrence of the abnormal operation of the wafer chuck 20 can be realized based on (the change of) the drive current of the motor Mo.

Figure 9:
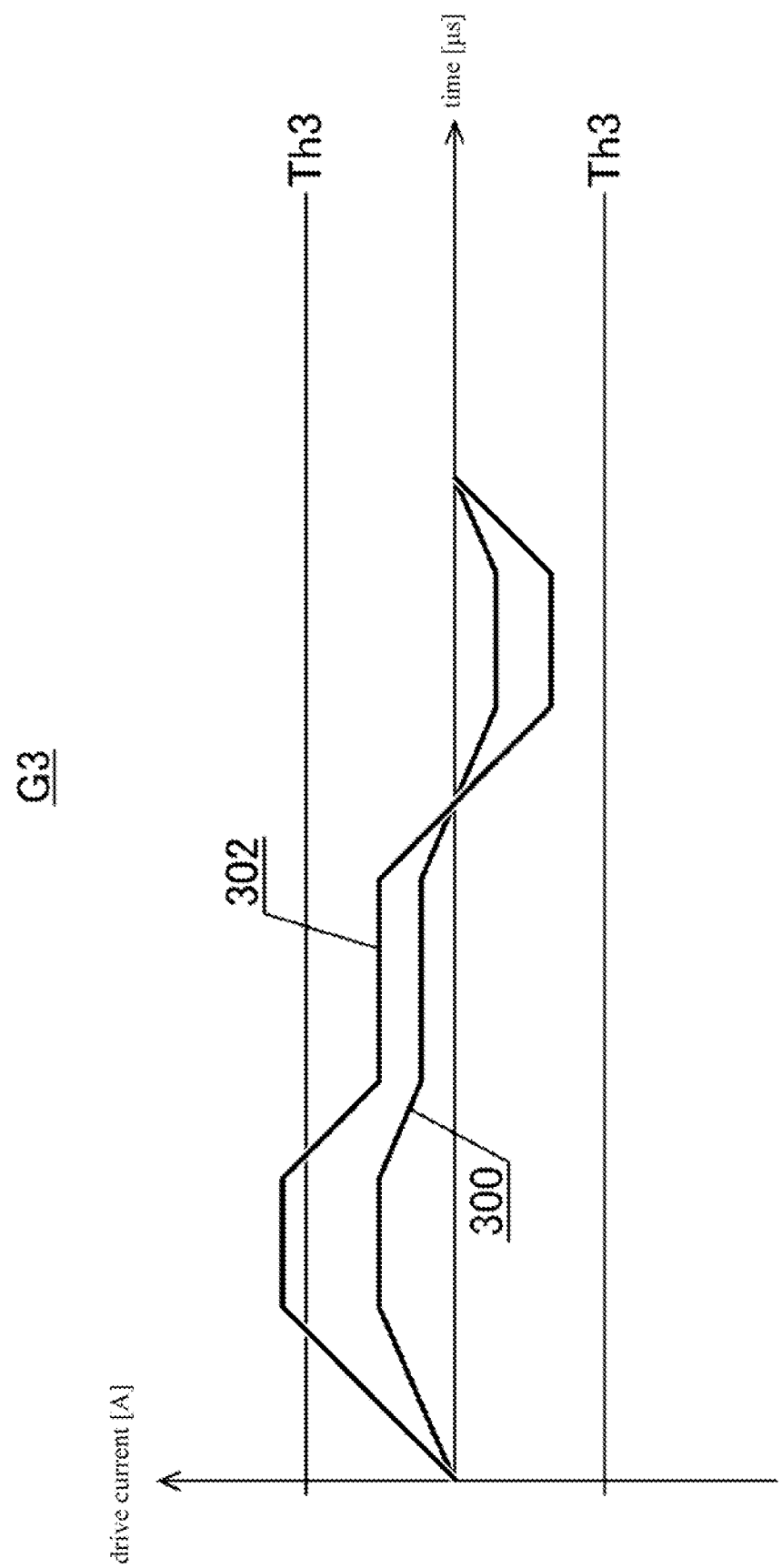
FIG. 9 is a graph showing a waveform of a drive current of a motor when a wafer chuck is operated.

FIG. 9 is a graph showing the waveform of the drive current of the motor when the wafer chuck is operated. The third graph G3 shown in FIG. 9 indicates the temporal change of the drive current of the motor Mo. The horizontal axis of the third graph G3 is the time. A unit of the time is a microsecond (µs). The vertical axis of the third graph G3 is the drive current. A unit of the drive current is an ampere (A). Here, since the drive current having the same current waveform flows through a plurality of phases provided on the motor Mo while the phase is shifted, the drive current of the motor Mo showing the waveform shown in FIG. 9 can be the drive current flowing through one arbitrary phase. Note that the same current waveform here can have a variation due to the electric characteristics of each phase of the driver 100 and the motor Mo.

A first current waveform 300 in the third graph G3 indicates the drive current of the motor Mo when the wafer chuck 20 is normally operated. On the other hand, in a second current waveform 302, there is a period where the drive current of the motor Mo exceeds the predetermined third threshold value Th3.

The information acquisition unit 62 shown in FIG. 5 acquires a plurality of drive current information in time series at the predetermined sampling period. The drive current information includes the magnitude of the drive current of the motor Mo detected by using the drive current detection unit 112 shown in FIG. 6.

The analysis unit 64 analyzes the drive current information acquired in time series. The diagnosis unit 66 determines that the abnormal operation of the wafer chuck 20 occurs based on the analysis result of the drive current information when the magnitude of the drive current exceeds the third threshold value Th3.

When it is determined that the abnormal operation of the wafer chuck 20 occurs, the movement controller 52 stops the operation of the wafer chuck 20 and lowers the wafer chuck 20 to solve the contact state between the wafer W and the probe needle 35.

Operation and Effect of Second Embodiment

The following operation and effect can be obtained by the second embodiment of the prober.

[1]

During the operation of the wafer chuck 20, the torque information including the magnitude of the generation torque of the motor Mo is acquired in each direction of the wafer chuck 20 and whether or not the abnormal operation of the wafer chuck 20 occurs is determined based on the analysis result of the torque information.

Consequently, the occurrence of the abnormal operation of the wafer chuck 20 during the operation of the wafer chuck 20 can be realized. Even when it is difficult to realize the occurrence of the abnormal operation from the position deviation or when the threshold value (threshold value Th1) of the position deviation cannot be set large enough, the occurrence of the abnormal operation can be realized more correctly.

[2]

When the generation torque of the motor Mo exceeds the predetermined threshold value, it is determined that the abnormal operation of the wafer chuck 20 occurs. Consequently, the occurrence of the abnormal operation of the wafer chuck 20 during the operation of the wafer chuck 20 is realized by applying the determination of the threshold value with respect to the magnitude of the generation torque of the motor Mo.

[3]

During the operation of the wafer chuck 20, the drive current information including the magnitude of the drive current of the motor Mo is acquired in each direction of the wafer chuck 20 and whether or not the abnormal operation of the wafer chuck 20 occurs is determined based on the analysis result of the drive current information.

Consequently, the occurrence of the abnormal operation of the wafer chuck 20 during the operation of the wafer chuck 20 can be realized.

[4]

When the magnitude of the drive current of the motor Mo exceeds the predetermined threshold value, it is determined that the abnormal operation of the wafer chuck 20 occurs. Consequently, the occurrence of the abnormal operation of the wafer chuck 20 during the operation of the wafer chuck 20 is realized by applying the determination of the threshold value with respect to the magnitude of the drive current of the motor Mo.

[5]

When it is determined that the abnormal operation of the wafer chuck 20 occurs during the operation of the wafer chuck 20, the movement controller 52 controls the Z motor 18A for lowering the wafer chuck 20 to move the wafer W far from the probe needle 35. Consequently, the damage of the wafer W, the probe card 26 and the like due to the occurrence of the abnormal operation of the wafer chuck 20 can be suppressed.

[Example of Applying Prober to Drive Control Device and Drive Control Method]

The prober computer 40 shown in FIG. 4 and FIG. 5 functions as the drive control device of the prober 10. In addition, the process of determining the occurrence of the abnormal operation of the wafer chuck 20 applied to the prober computer 40 is performed as the drive control method of the prober 10.

[Modified Example of Prober]

In the above described first embodiment and the second embodiment, the prober provided with one measurement stage including the wafer chuck 20 for sucking and supporting the wafer W is exemplified. However, the exemplified drive control can be also applied to the prober provided with a plurality of measurement stages.

In the above described embodiments, the components can be arbitrarily changed, added and deleted within a range not deviating from the purpose. The contents of the present disclosure are not limited to the above described embodiments and modified examples. A lot of modifications are possible by a person with ordinary knowledge in the art within technical ideas. In addition, the embodiments, the modified examples and the application examples can be arbitrarily combined with each other.

DESCRIPTION OF THE REFERENCE NUMERALS

9: semiconductor chip, 9a: electrode pad, 10: prober, 12: base, 13: Y stage, 14: Y moving unit, 14A: Y motor, 14B: Y position detector, 15: X stage, 16: X moving unit, 16A: X motor, 16B: X position detector, 17: 20 stage, 18: 20 moving unit, 18A: Z motor, 18B: Z position detector, 18C: θ motor, 18D: θ angle detector, 20: wafer chuck, 23: supports, 24: head stage, 25: card holder, 25a: holding hole, 26: probe card, 29: wafer alignment camera, 30: up-down stage, 31: needle alignment camera, 32: cleaning plate, 35: probe needle, 40: prober computer, 44: needle position acquisition unit, 46: wafer information acquisition unit, 48: display controller, 50: display, 52: movement controller, 54: X driver, 56: Y driver, 58: Z driver, 60: θ driver, 62: information acquisition unit, 64: analysis unit, 66: diagnosis unit, 100: driver, 102: operation instruction acquisition unit, 104: drive current command generating unit, 106: drive current output unit, 108: position information acquisition unit, 110: position deviation calculation unit, 112: drive current detection unit, 114: torque calculation unit, 200: first position deviation waveform, 202: second position deviation waveform, 212: third position deviation waveform, 214: waveform element, 300: first current waveform, 302: second current waveform, G1: first graph, G2: second graph, G3: third graph, Mo: motor, Ps: motor power source, Pd: position detector, Th1: first threshold value, Th3: third threshold value, W: wafer

The invention claimed is:

1. A drive control device comprising:
an operation instruction transmission unit configured to transmit an operation instruction to a motor driving device for operating a movement mechanism of a wafer chuck which holds a wafer on which a plurality of semiconductor chips is formed;

an information acquisition unit configured to acquire a position deviation information including at least one position deviation at an actual position of the wafer chuck with respect to a position of the wafer chuck in the operation instruction;

an analysis unit configured to analyze the position deviation information; and a determination unit configured to determine an existence or absence of an occurrence of an abnormal operation of the movement mechanism based on an analysis result of the position deviation information.

2. The drive control device according to claim 1, wherein the determination unit is configured to determine that the abnormal operation of the movement mechanism occurs when the at least one position deviation exceeds a predetermined first threshold value in a state that the movement mechanism is stopped and the wafer is in contact with a probe which supplies a test signal to the plurality of semiconductor chips.

3. The drive control device according to claim 1, wherein the at least one position deviation includes a plurality of position deviations, the information acquisition unit is configured to acquire the plurality of position deviations in time series in a state that the movement mechanism is stopped and the wafer is in contact with a probe which supplies a test signal to the plurality of semiconductor chips, the analysis unit is configured to perform a frequency analysis of the plurality of position deviations in time series, and the determination unit is configured to determine that the abnormal operation of the movement mechanism occurs when frequencies of the plurality of position deviations vary from each other.

4. The drive control device according to claim 1, wherein the information acquisition unit acquires torque information including a magnitude of a generation torque of a motor when the movement mechanism is operated based on the operation instruction, the analysis unit is configured to analyze the torque information, and the determination unit is configured to determine the existence or absence of the occurrence of the abnormal operation of the movement mechanism based on an analysis result of the torque information.

5. The drive control device according to claim 4, wherein the determination unit is configured to determine that the abnormal operation of the movement mechanism occurs when the generation torque of the motor exceeds a predetermined second threshold value.

6. The drive control device according to claim 1, wherein the information acquisition unit is configured to acquire a drive current information including a magnitude of a drive current supplied to the motor when the movement mechanism is operated based on the operation instruction, the analysis unit is configured to analyze the drive current information, and the determination unit is configured to determine the existence or absence of the occurrence of the abnormal operation of the movement mechanism based on an analysis result of the drive current information.

7. The drive control device according to claim 6, wherein the determination unit is configured to determine that the abnormal operation of the movement mechanism occurs when the magnitude of the drive current exceeds a third threshold value.

8. The drive control device according to claim 1, wherein the operation instruction transmission unit is configured to transmit the operation instruction to the motor driving device for separating a probe which supplies a test signal to the plurality of semiconductor chips and the wafer from each other when the abnormal operation of the movement mechanism occurs.

9. The drive control device according to claim 1, further comprising:

a display controller configured to transmit a display signal indicating a determination result of the determination unit to a display.

10. A drive control method comprising steps performed by a computer of:

an operation instruction transmission step of transmitting an operation instruction to a motor driving device for operating a movement mechanism of a wafer chuck which holds a wafer on which a plurality of semiconductor chips is formed;

an information acquisition step of acquiring a position deviation information including at least one position deviation at an actual position of the wafer chuck with respect to a position of the wafer chuck in the operation instruction;

an analysis step of analyzing the position deviation information; and a determination step of determining an existence or absence of an occurrence of an abnormal operation of the movement mechanism based on an analysis result of the position deviation information.

11. A prober comprising:

a wafer chuck configured to hold a wafer on which a plurality of semiconductor chips is formed;

a test head having a probe which supplies a test signal to the plurality of semiconductor chips;

a movement mechanism configured to move the wafer chuck relatively to the probe;

a motor configured to operate the movement mechanism;

a motor driving device configured to supply a drive current to the motor; and a drive control device configured to transmit an operation instruction to the motor driving device, wherein the drive control device includes:

an operation instruction transmission unit configured to transmit an operation instruction to the motor driving device for operating the movement mechanism of the wafer chuck which holds the wafer on which the plurality of semiconductor chips is formed;

an information acquisition unit configured to acquire a position deviation information including at least one position deviation at an actual position of the wafer chuck with respect to a position of the wafer chuck in the operation instruction;

an analysis unit configured to analyze the position deviation information; and a determination unit configured to determine an existence or absence of an occurrence of an abnormal operation of the movement mechanism based on an analysis result of the position deviation information.

* * * * *